United States Patent
Kojima et al.

(10) Patent No.: US 10,008,592 B1
(45) Date of Patent: Jun. 26, 2018

(54) SEMICONDUCTOR DEVICE (71) Applicants: FUJI ELECTRIC CO., LTD., Kawasaki-shi, Kanagawa (JP); NATIONAL INSTITUTE OF ADVANCED INDUSTRIAL SCIENCE AND TECHNOLOGY, Tokyo (JP)

(72) Inventors: Takahito Kojima, Matsumoto (JP); Yasunori Tanaka, Tsukuba (JP); Shinsuke Harada, Tsukuba (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days. days.

(21) Appl. No.: 15/800,884

(22) Filed: Nov. 1, 2017

(30) Foreign Application Priority Data

Dec. 28, 2016 (JP) .................................. 2016-256895

(51) Int. Cl.

| H01L 31/0312 | (2006.01) |
|---|---|
| H01L 29/78 | (2006.01) |
| H01L 29/66 | (2006.01) |
| H01L 29/06 | (2006.01) |
| H01L 29/16 | (2006.01) |
| H01L 29/417 | (2006.01) |
| H01L 29/739 | (2006.01) |
| H01L 29/08 | (2006.01) |

(52) U.S. Cl.
CPC ...... *H01L 29/7813* (2013.01); *H01L 29/0623* (2013.01); *H01L 29/0696* (2013.01); *H01L 29/0878* (2013.01); *H01L 29/1608* (2013.01); *H01L 29/41766* (2013.01); *H01L 29/66068* (2013.01); *H01L 29/7397* (2013.01); *H01L 29/7811* (2013.01)

(58) Field of Classification Search
CPC .................... H01L 29/0623; H01L 29/0696
See application file for complete search history.

(56) References Cited

U.S. PATENT DOCUMENTS

| 6,180,958 B1 | 1/2001 | Cooper, Jr. |
| 2008/0012026 A1 | 1/2008 | Tsuji |
| 2009/0114923 A1 | 5/2009 | Iwamuro |

FOREIGN PATENT DOCUMENTS

| JP | 2008-016747 A | 1/2008 |
| JP | 5054255 B2 | 10/2012 |
| JP | 5444608 B2 | 3/2014 |

*Primary Examiner* — Samuel Gebremariam
(74) *Attorney, Agent, or Firm* — Rabin & Berdo, P.C.

(57) ABSTRACT

Each first $p^+$-type region is provided between adjacent trenches embedded with a MOS gate and is in contact with a p-type base region. Second $p^+$-type regions face a bottom and bottom corner portions of the trenches in a depth direction. An n-type CS region is a current spread layer provided between the first $p^+$-type regions and the second $p^+$-type regions. The n-type CS region is provided only in an active region and an end thereof is positioned at a boundary of the active region and an edge termination region. Further, the n-type CS region extends to be flush with or farther inward than an outermost first $p^+$-type region. An outermost $p^{++}$-type contact region extends from a drop between the active region and the edge termination region to the edge termination region and extends beyond the n-type CS region.

9 Claims, 10 Drawing Sheets

SEMICONDUCTOR DEVICE

CROSS REFERENCE TO RELATED APPLICATIONS

This application is based upon and claims the benefit of priority of the prior Japanese Patent Application No. 2016-256895, filed on Dec. 28, 2016, the entire contents of which are incorporated herein by reference.

BACKGROUND OF THE INVENTION

1. Field of the Invention

Embodiments of the invention relate to a semiconductor device.

2. Description of the Related Art

Conventionally, planar gate structures including a MOS gate in a flat planar shape on a semiconductor base and trench gate structures in which a MOS gate is embedded in a trench formed in a semiconductor base are commonly known as MOS gate structures of a vertical metal oxide semiconductor field effect transistor (MOSFET). In a trench gate structure, a channel is formed along a trench sidewall and is substantially perpendicular with respect to a base front surface. As a result, a trench gate structure may increase cell density per unit volume to a greater extent than a planar gate structure in which a channel is formed parallel to the base front surface. Therefore, a trench gate structure may increase current density per unit volume and is advantageous in terms of cost.

On the other hand, with a trench gate structure, in order to form a channel vertically with respect to the base front surface, a gate insulating film is provided along an entire inner wall of the trench. At a bottom of the trench, the gate insulating film is near a drain electrode on a base rear surface. Therefore, at the bottom of the trench, the gate insulating film tends to be subject to high electric field. To resolve this problem, a structure has been proposed where in a semiconductor device using a semiconductor material (hereinafter, wide bandgap semiconductor) having a bandgap wider than that of silicon (Si), a p-type region covering the bottom of the trench is arranged to mitigate the electric field strength at the trench bottom. Further, a structure has been proposed in which a p-type region in contact with a p-type base region is arranged between trenches (mesa portion), forming a pn junction between the p-type region and an n-type drift layer, at a position deeper on a drain side than the trench bottom is.

Further, a structure is commonly known where in a vertical MOSFET, a carrier spread (CS) region is provided on a base front surface side in a drift layer, the CS region having a higher impurity concentration than a drift layer and the same conductivity type as the drift layer. By providing the CS region, Junction FET (JFET) resistance may be reduced and a low ON resistance may be achieved. Further, in an insulated gate bipolar transistor (IGBT), a barrier of minority carriers results and the CS region functions as a carrier storage region storing minority carriers. Therefore, current density between a collector and an emitter increases and a conductivity modulation effect is enhanced.

Figure 14:
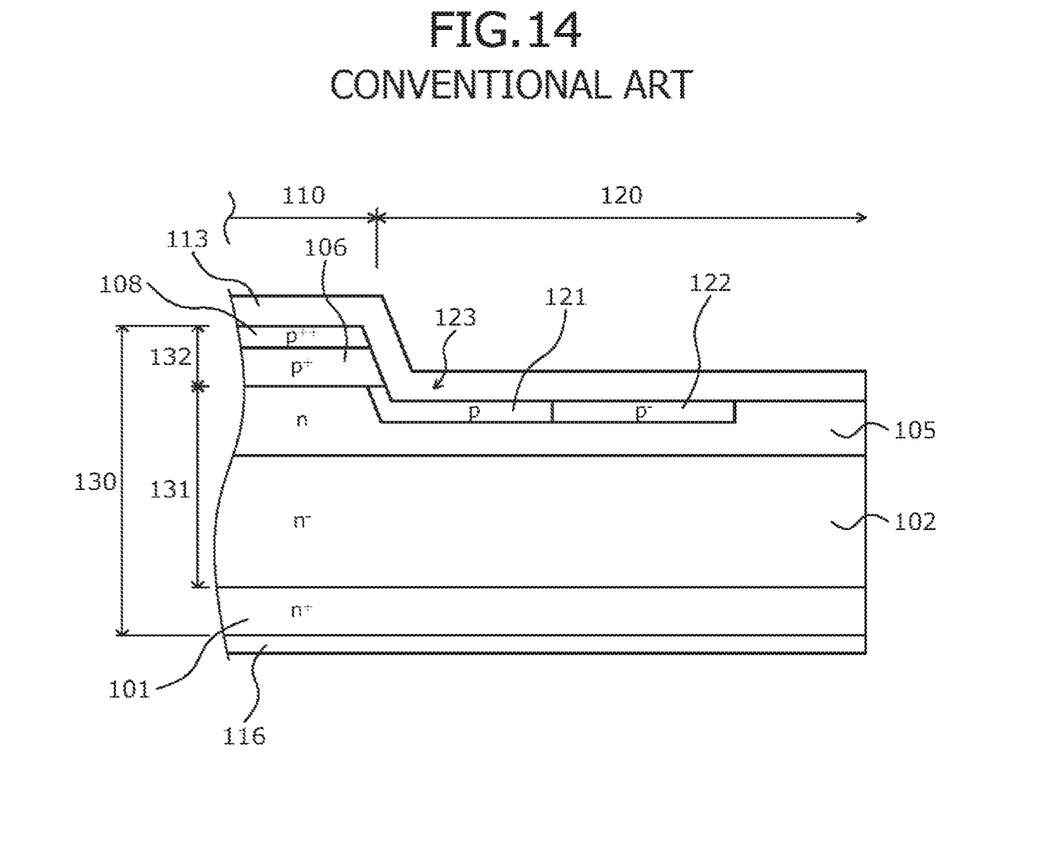
FIG. 14 is a cross-sectional view of a structure of an edge termination region of a conventional semiconductor device.

A structure of an edge termination region of a conventional semiconductor device will be described taking a MOSFET as an example. FIG. 14 is a cross-sectional view of a structure of an edge termination region of a conventional semiconductor device. The semiconductor device depicted in FIG. 14 includes a MOS gate (not-depicted) on a front surface side ($p^+$-type base region 106 side) of a semiconductor base (semiconductor chip) 130. The semiconductor base 130 is formed by sequentially forming by epitaxial growth on an $n^+$-type semiconductor substrate 101, plural semiconductor layers 131, 132 to become an $n^-$-type drift region 102 and the $p^+$-type base region 106. A drop 123 in a front surface of the semiconductor base 130 is formed between an active region 110 and an edge termination region 120. The active region 110 is a region through which current flows in an ON state. The edge termination region 120 surrounds a periphery of the active region 110.

An n-type CS region 105 is provided on a surface layer of the $n^-$-type drift region 102, on a side of the $n^-$-type drift region 102 facing the $p^+$-type base region 106. Further, the n-type CS region 105 is provided from the active region 110, across the edge termination region 120, to reach a chip edge and the edge termination region 120, and is exposed at the base front surface. At the portion of the n-type CS region 105 exposed at the base front surface, a junction termination extension (JTE) structure adjacent to an outer side of the $p^+$-type base region 106 is provided. The JTE structure is constituted by p-type regions (first and second JTE regions 121, 122) having a lower impurity concentration than that of the $p^+$-type base region 106. Reference numerals 108, 113, and 116 represent a $p^{++}$-type contact region, an interlayer insulating film, and a collector electrode, respectively.

A device proposed as a semiconductor device that includes a CS region, includes between a drift region and a base region, at a depth from the base front surface shallower than that of the trench bottom, a CS region formed by epitaxial layers (for example, refer to Japanese Laid-Open Patent Publication No. 2008-16747 (paragraphs 0018 to 0019, FIG. 5), Japanese Patent No. 5444608 (paragraphs 0016 to 0017, FIGS. 1, 2), and Japanese Patent No. 5054255 (page 14 (line 32) to page 15 (line 14), FIG. 20)).

SUMMARY OF THE INVENTION

According to one aspect of the present invention, a semiconductor device includes a breakdown voltage structure farther on an outer side than an active region through which current flows; a semiconductor substrate containing a semiconductor material having a bandgap wider than that of silicon; a first semiconductor layer of a first conductivity type provided on a front surface of the semiconductor substrate, the first semiconductor layer containing the semiconductor material; a second semiconductor layer of a second conductivity type provided in the active region, on a surface on a first side of the first semiconductor layer opposite a second side of the first semiconductor layer facing the semiconductor substrate, the second semiconductor layer containing the semiconductor material; a first semiconductor region of the second conductivity type selectively provided in a surface layer on the first side of the first semiconductor layer to be in contact with second semiconductor layer, an impurity concentration of the first semiconductor region is higher than that of the second semiconductor layer; a second semiconductor region of the second conductivity type selectively provided in the first semiconductor layer to be separate from the second semiconductor layer and the first semiconductor region, an impurity concentration of the second semiconductor region is higher than that of the second semiconductor layer; a third semiconductor region of the first conductivity type selectively provided in the surface layer on the first side of the first semiconductor layer to be in contact with the first semiconductor region and the second semiconductor region, an impurity concentration of the third semiconductor region is higher than that of the first semiconductor layer; a fourth semiconductor region of the first conductivity type selectively provided in the second semiconductor layer; a fifth semiconductor region of the second conductivity type selectively provided in the second semiconductor layer, an impurity concentration of the fifth semiconductor region is higher than that of the second semiconductor layer; a trench penetrating the fourth semiconductor region and the second semiconductor layer and reaching the third semiconductor region, the trench facing the second semiconductor region in a depth direction; a gate electrode provided in the trench, via a gate insulating film; a first electrode in contact with the second semiconductor layer and the fourth semiconductor region; and a second electrode provided on a rear surface of the semiconductor substrate. The third semiconductor region is provided in the active region, and the fifth semiconductor region is flush with the third semiconductor region or extends farther inward than the third semiconductor region.

In the semiconductor device, the third semiconductor region terminates farther outward than the first semiconductor region.

In the semiconductor device, the third semiconductor region is provided only in the active region.

In the semiconductor device, the third semiconductor region is in contact with the breakdown voltage structure.

In the semiconductor device, a sixth semiconductor region of the first conductivity type provided in the active region, in the surface layer on the first side of the first semiconductor layer to be in contact with the third semiconductor region, an impurity concentration of the sixth semiconductor region is lower than that of the third semiconductor region. The breakdown voltage structure is provided in the sixth semiconductor region.

In the semiconductor device, the impurity concentration of the sixth semiconductor region is equal to or lower than that of the first semiconductor layer.

In the semiconductor device, the third semiconductor region is an epitaxial layer provided between the first semiconductor layer and the second semiconductor layer, and the sixth semiconductor region is provided in a portion of the epitaxial layer outside the active region and penetrates the epitaxial layer in the depth direction.

In the semiconductor device, the breakdown voltage structure is constituted by a plurality of seventh semiconductor regions of the second conductivity type provided in the surface layer on the first side of the first semiconductor layer, the plurality of seventh semiconductor regions have a concentric shape surrounding a periphery of the active region, respective impurity concentrations of the plurality of seventh semiconductor regions are lower than that of the second semiconductor layer and are inversely related to a distance of the plurality of seventh semiconductor regions from the active region.

In the semiconductor device, the semiconductor material is silicon carbide.

Objects, features, and advantages of the present invention are specifically set forth in or will become apparent from the following detailed description of the invention when read in conjunction with the accompanying drawings.

DETAILED DESCRIPTION OF THE INVENTION

Embodiments of a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

First issues related to the conventional structures are discussed. In the conventional structures, by providing the n-type CS region 105, problems arise in that the process margin of the impurity concentration of the JTE structure decreases, the breakdown voltage of the edge termination region 120 decreases, and characteristics of the ON resistance when current flows between the drain and source in the ON state degrade.

Figure 1:
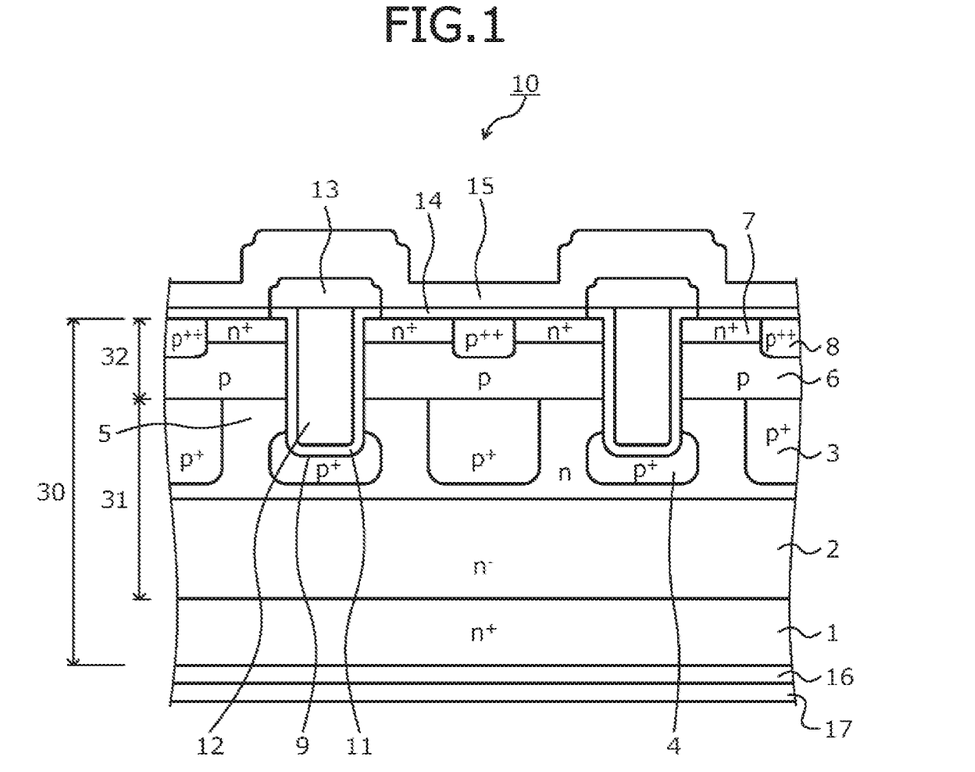
FIG. 1 is a cross-sectional view of a structure of an active region of a semiconductor device according to a first embodiment.
Figure 2:
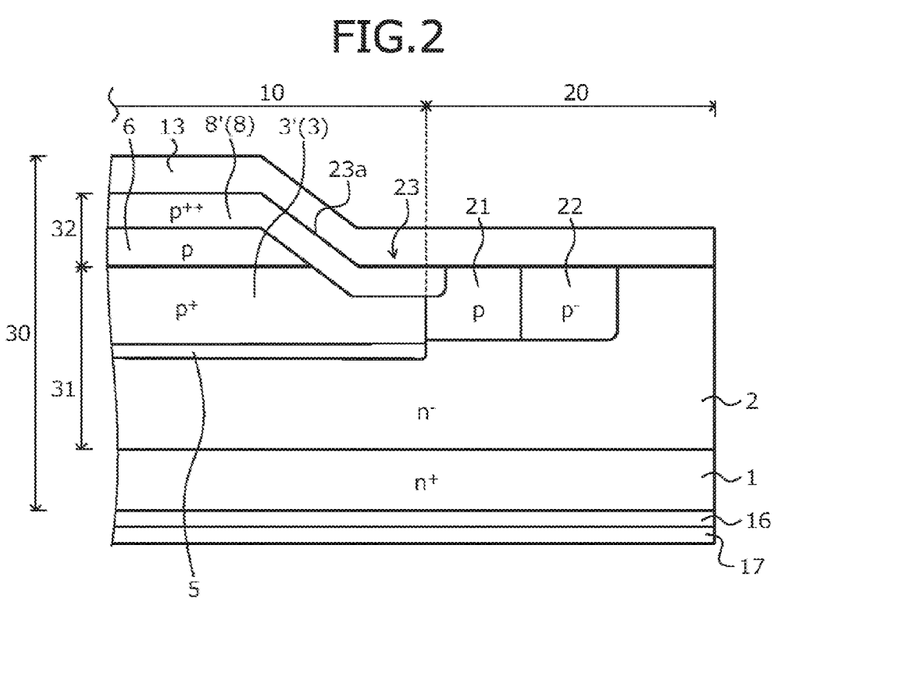
FIG. 2 is a cross-sectional view of a structure of an edge termination region of the semiconductor device according to the first embodiment.

According to the present invention, a semiconductor device is formed using a semiconductor material (wide bandgap semiconductor) having a bandgap that is wider than that of silicon (Si). Herein, a MOSFET using, for example, silicon carbide (SiC) as a wide bandgap semiconductor will be described as an example. FIG. 1 is a cross-sectional view of a structure of an active region of the semiconductor device according to a first embodiment. In FIG. 1, only two unit cells (functional units of an element) are depicted and other unit cells adjacent to these two unit cells are not depicted. FIG. 2 is a cross-sectional view of a structure of an edge termination region of the semiconductor device according to the first embodiment.

The semiconductor device according to the first embodiment depicted in FIGS. 1 and 2 includes an active region 10 and an edge termination region 20 on a semiconductor base (silicon carbide base: semiconductor chip) 30 containing silicon carbide. The active region 10 is a region through which current flows in a direction of thickness of the base in the ON state. The edge termination region 20 is provided between the active region 10 and the chip edge, and surrounds a periphery of the active region 10. The edge termination region 20 is a region that mitigates the electric field of a base front surface (front surface of the silicon carbide base 30) side of an n⁻-type drift region 2 and maintains the breakdown voltage.

The silicon carbide base 30 is formed by sequentially forming by epitaxial growth on an n⁺-type supporting substrate (n⁺-type silicon carbide substrate) 1 containing silicon carbide, plural silicon carbide layers (first and second semiconductor layers) 31, 32 to become the n⁻-type drift region 2 and p-type base regions 6. In the active region 10, on the front surface (surface on the p-type base region 6 side) side of the silicon carbide base 30, a MOS gate is provided that includes first and second p⁺-type regions 3, 4, the p-type base regions 6, n⁺-type source regions (fourth semiconductor regions) 7, p⁺⁺-type contact regions (fifth semiconductor regions) 8, trenches 9, gate insulating films 11, and gate electrodes 12.

In particular, the first and the second p⁺-type regions (first and second semiconductor regions) 3, 4 are each provided selectively in a base front surface side of an n⁻-type silicon carbide layer 31. Each of the first p⁺-type regions 3 is provided between a pair of adjacent trenches 9 (mesa portion) and is in contact with the p-type base regions 6. Some of the first p⁺-type regions 3 may extend on the trench 9 side to partially be in contact with the second p⁺-type regions 4. The first p⁺-type region 3 (hereinafter, outermost first p⁺-type region 3') of the unit cell arranged outermost (chip edge side) is provided to the boundary of the active region 10 and the edge termination region 20, along a direction (hereinafter, lateral direction) parallel to the base front surface.

The second p⁺-type regions 4 are arranged separated from the first p⁺-type regions 3 and the p-type base regions 6. The second p⁺-type regions 4 further face a bottom and bottom corner portions of the trenches 9 along a depth direction. In other words, a width of the second p⁺-type regions 4 is equal to or greater than a width of the trenches 9. The second p⁺-type regions 4 may be provided to cover a portion of the gate insulating films 11 at the bottom and the bottom corner portions of the trenches 9. A bottom corner portion of a trench 9 is a boundary of the bottom and a side wall of the trench 9. In FIG. 1, a portion of the gate insulating film 11 at the bottom and the bottom corner portions of the corresponding trench 9 is covered by the second p⁺-type regions 4.

Further, in the surface layer on the base front surface side of the n⁻-type silicon carbide layer 31, an n-type region (hereinafter, n-type CS region) 5 is selectively provided so as to be in contact with the p-type base regions 6. The n-type CS region (third semiconductor region) 5 is a current spread layer (CSL) that lowers carrier spread resistance. The n-type CS region 5 is provided between the first and the second p⁺-type regions 3, 4 and is in contact with the first and the second p⁺-type regions 3, 4. In addition, the n-type CS region 5 faces the gate electrodes 12 across the gate insulating films 11 at the inner walls of the trenches 9.

Further, the n-type CS region 5 may reach a position on the drain side deeper than positions of the first and the second p⁺-type regions 3, 4 and may cover the drain side of the first and the second p⁺-type regions 3, 4. In other words, the n-type CS region 5 may be provided so as to encompass the first and the second p⁺-type regions 3, 4. Thus, at positions on the drain side deeper than the bottom of the trenches 9, pn junctions between the n-type CS region 5 and the first and the second p⁺-type regions 3, 4 are formed whereby an application of high electric field to the gate insulating films 11 at the bottom of the trenches 9 may be prevented by the pn junctions.

Further, the n-type CS region 5, for example, is provided across the entire active region 10. An end of the n-type CS region 5 is positioned at the boundary of the active region 10 and the edge termination region 20. In other words, the n-type CS region 5 is provided only in the active region 10 and is provided so as to be flush with an end of the p⁺-type region 3' or so as to not extend beyond the end of the p⁺-type region 3'. Further, the n-type CS region 5 covers a portion of a drain side surface of a portion of a first JTE region 21 (described later) extending in the active region 10. A portion of the n⁻-type silicon carbide layer 31 excluding the first and the second p⁺-type regions 3, 4 and the n-type CS region 5 is the n⁻-type drift region 2.

The n⁺-type source regions 7 and the p⁺⁺-type contact regions 8 are each selectively provided in the surface layer on the base front surface side of the p-type silicon carbide layer 32 so that the n⁺-type source regions 7 are in contact with the p⁺⁺-type contact regions 8. The p⁺⁺-type contact region 8 (hereinafter, an outermost p⁺⁺-type contact region 8') of the cell that is arranged outermost is provided along a drop 23 (described later) between the active region 10 and the edge termination region 20, and is in contact with the outermost first p⁺-type region 3' at the drop 23.

Further, the outermost p⁺⁺-type contact region 8' extends from the drop 23 between the active region 10 and the edge termination region 20, to the edge termination region 20 and at the base front surface of the edge termination region 20, and is in contact with the first JTE region 21. In other words, the outermost p⁺⁺-type contact region 8' extends farther outward than the n-type CS region 5 does. Portions of the p-type silicon carbide layer 32 excluding the n⁺-type source regions 7 and the p⁺⁺-type contact regions 8 are the p-type base regions 6.

The trenches 9 penetrate the n⁺-type source regions 7 and the p-type base regions 6 from the base front surface and reach the n-type CS region 5. In the trenches 9, the gate insulating films 11 are provided along the side walls of the trenches 9. Further, in the trenches 9, the gate electrodes 12 are provided on the gate insulating films 11. A source-side end portion of the gate electrodes 12 may or may protrude outwardly from the base front surface. An interlayer insulating film 13 is provided on the entire the base front surface of the active region 10 and the edge termination region 20, covering the gate electrodes 12.

Source electrodes (first electrodes) 14 are in contact with the n⁺-type source regions 7 and the p⁺⁺-type contact regions 8 via contact holes opened in the interlayer insulating film 13, and are electrically insulated from the gate electrodes 12 by the interlayer insulating film 13. On the source electrodes 14, a source pad 15 is provided. On a rear surface (rear surface of the n⁺-type silicon carbide substrate 1 becoming an n⁺-type drain region) of the silicon carbide base 30, a drain electrode (second electrode) 16 is formed. On the drain electrode 16, a drain pad 17 is provided.

The p-type silicon carbide layer 32 is removed from the entire edge termination region 20, making the front surface of the silicon carbide base 30 lower in the edge termination region 20 than in the active region 10 (recessed toward the drain side) and thereby forming the drop 23. In other words, in the edge termination region 20, the n⁻-type silicon carbide layer 31 is exposed at the front surface of the silicon carbide base 30. A connecting portion (a stair of the drop 23) 23a between the base front surfaces (upper and lower) of the active region 10 and the edge termination region 20 may have a slope with respect to the base front surface.

In the edge termination region 20, a breakdown voltage structure such as a JTE structure is provided in the n⁻-type silicon carbide layer 31 exposed at the base front surface by the drop 23 between the edge termination region 20 and the active region 10. As described, since the n-type CS region 5 is not provided in the edge termination region 20, the n$^-$-type silicon carbide layer 31 exposed at the base front surface in the edge termination region 20 constitutes the n$^-$-type drift region 2. In the n$^-$-type drift region 2, a JTE structure is provided. The JTE structure is constituted by p-type regions having impurity concentrations lower than that of the p-type base region 6. The JTE structure has a function of mitigating electric field in the edge termination region 20.

The JTE structure is formed by plural adjacent p-type regions (herein, 2 regions including first and second JTE regions 21, 22) having a concentric shape surrounding a periphery of the active region, and the farther outward the p-type region is arranged, the lower the impurity concentration thereof is. The first JTE region (p-type region) 21 is provided at an innermost side (the active region 10 side) of the edge termination region 20 and is in contact with the outermost p$^{++}$-type contact region 8'. Further, the first JTE region 21 extends from the edge termination region 20 to the active region 10 and is in contact with the outermost first p$^+$-type region 3'. The second JTE region (p$^-$-type region) 22 is provided farther outward than the first JTE region 21 and is in contact with the first JTE region 21.

Figure 3:
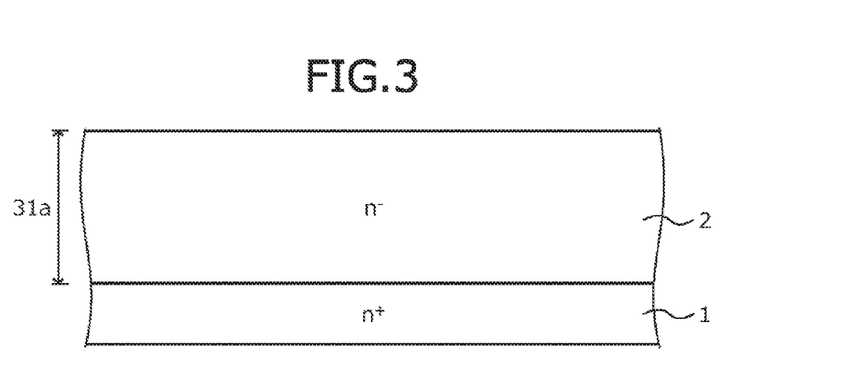
FIGS. 3, 4A, 4B, 5A, 5B, 6A, 6B, 7, and 8 are cross-sectional views of the silicon carbide semiconductor device according to the first embodiment during manufacture.

A method of manufacturing a silicon carbide semiconductor device according to the first embodiment will be described. FIGS. 3, 4A, 4B, 5A, 5B, 6A, 6B, 7, and 8 are cross-sectional views of the silicon carbide semiconductor device according to the first embodiment during manufacture. FIGS. 4A, 5A, 6A, 7, and 8 depict the active region 10. FIGS. 4B, 5B, and 6B depict the edge termination region 20. First, as depicted in FIG. 3, the n$^+$-type silicon carbide substrate 1 to become the n$^+$-type drain region is prepared. The n$^+$-type silicon carbide substrate 1, for example, may be a silicon carbide single crystal substrate doped with nitrogen (N) and having (0001) face, a so-called Si face, as a front surface.

On the front surface of the n$^+$-type silicon carbide substrate 1, for example, the n$^-$-type silicon carbide layer 31a doped with an n-type impurity such as nitrogen is formed by epitaxial growth and becomes the n$^-$-type silicon carbide layer 31 described above. A thickness of the n$^-$-type silicon carbide layer 31a may be, for example, about 30 μm. Next, for example, an oxide film (not depicted) is formed on a surface of the n$^-$-type silicon carbide layer 31a by a deposition method such as plasma chemical vapor deposition (CVD). A portion of the oxide film corresponding to a formation region of the active region 10 is removed by photolithography and etching.

Figure 4A:
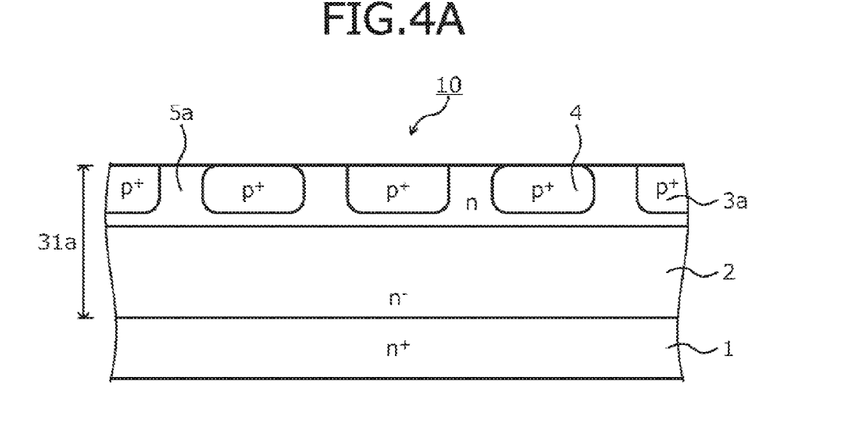
Figure 4B:
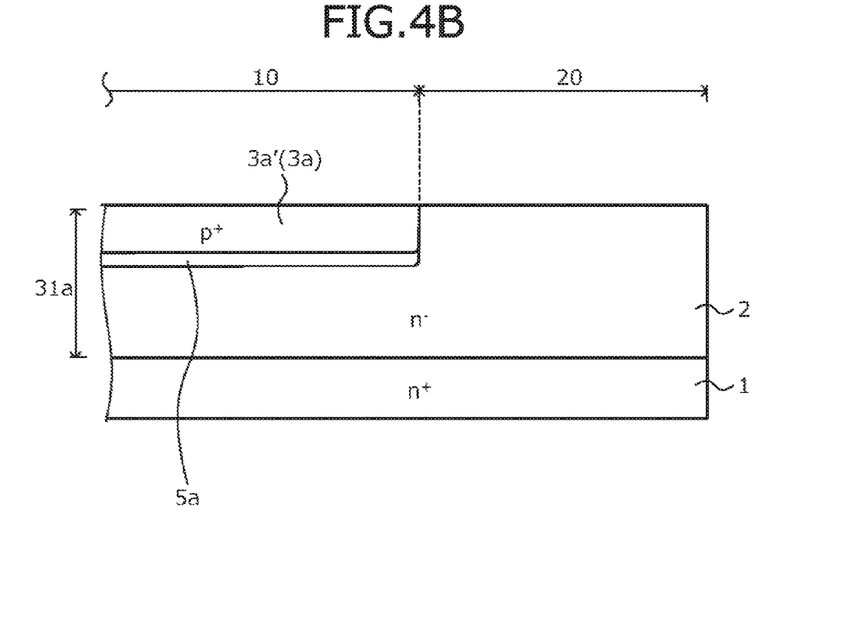

Next, for example, an n-type impurity such as nitrogen is ion implanted using the remaining portion of the oxide film as a mask (oxide film mask) thereby forming in a surface layer of the n$^-$-type silicon carbide layer 31a as depicted in FIGS. 4A and 4B, an n-type region (hereinafter, n-type partial region) 5a having a thickness of, for example, about 0.6 μm. An impurity concentration of the n-type partial region 5a may be, for example, about $1.0 \times 10^{17}/cm^3$. The n-type partial region 5a is formed in the active region 10 overall and an end of the n-type partial region 5a is positioned at the boundary of the active region 10 and the edge termination region 20 (FIG. 4B). The n-type partial region 5a is a portion of the n-type CS region 5. A portion of the n$^-$-type silicon carbide layer 31a farther on a drain side (the n$^+$-type silicon carbide substrate 1 side) than the n-type partial region 5a is becomes the n$^-$-type drift region 2. The oxide film mask used in forming the n-type partial region 5a is removed.

Next, for example, an oxide film (not depicted) is again formed on the surface of the n$^-$-type silicon carbide layer 31a by a deposition method. Portions of the oxide film corresponding to formation regions of the first and the second p$^+$-type regions 3, 4 are removed by photolithography and etching. Next, for example, a p-type impurity such as aluminum (Al) is ion implanted using the remaining portion of the oxide film as a mask (oxide film mask) whereby the second p$^+$-type regions 4 and p$^+$-type regions (hereinafter, p$^+$-type partial regions) 3a having a thickness of, for example, about 0.5 μm are each selectively formed in the surface layer (i.e., in the n-type partial region 5a) of the n$^-$-type silicon carbide layer 31a. An impurity concentration of the p$^+$-type partial regions 3a and the second p$^+$-type regions 4 may be, for example, about $5.0 \times 10^{18}/cm^3$. The p$^+$-type partial regions 3a are portions of the first p$^+$-type regions 3.

The p$^+$-type partial regions 3a and the second p$^+$-type regions 4 are arranged to recursively alternate along the lateral direction (FIG. 4A). An interval between the p$^+$-type partial regions 3a and the second p$^+$-type regions 4 may be, for example, about 1.5 μm. An end of the p$^+$-type partial region 3a farthest outward (hereinafter, the outermost p$^+$-type partial region 3a'), reaches the boundary of the active region 10 and the edge termination region 20 in the lateral direction (FIG. 4B). The oxide film mask used in forming the p$^+$-type partial regions 3a and the second p$^+$-type regions 4 is removed. The sequence in which the n-type partial region 5a and, the p$^+$-type partial regions 3a and the second p$^+$-type regions 4 are formed may be interchanged. The p$^+$-type partial regions 3a and the second p$^+$-type regions 4 may be formed by different ion implantation processes using different oxide film masks.

Figure 5A:
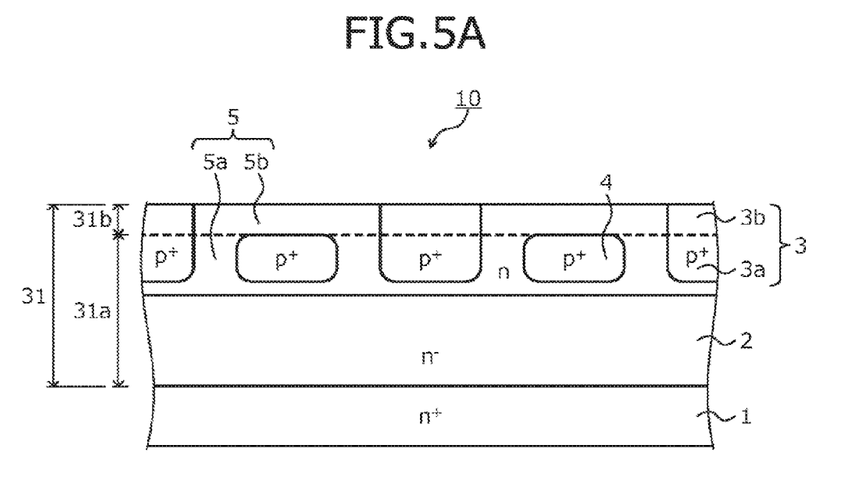
Figure 5B:
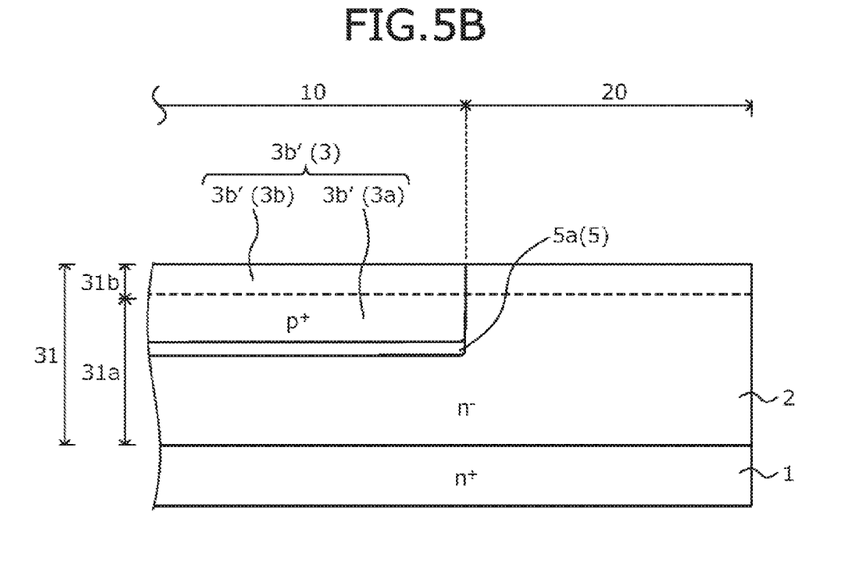

Next, as depicted in FIGS. 5A and 5B, for example, an n$^-$-type silicon carbide layer 31b doped with an n-type impurity such as nitrogen is formed by epitaxial growth on the n$^-$-type silicon carbide layer 31a to become the n$^-$-type silicon carbide layer 31. An impurity concentration and a thickness of the n$^-$-type silicon carbide layer 31b may be, for example, about $3.0 \times 10^{15}/cm^3$ and about 0.5 μm, respectively. Next, for example, an oxide film (not depicted) is formed on a surface of the n$^-$-type silicon carbide layer 31b by a deposition method. Portion of the oxide film corresponding to formation regions of the first p$^+$-type regions 3 are removed by photolithography and etching.

Next, for example, a p-type impurity such as aluminum is ion implanted using the remaining portion of the oxide film as a mask (oxide film mask) whereby p$^+$-type partial regions 3b are selectively formed at portions of the n$^-$-type silicon carbide layer 31b facing the p$^+$-type partial regions 3a, the p$^+$-type partial regions 3b reaching the p$^+$-type partial regions 3a (FIG. 5A). A width and impurity concentration of the p$^+$-type partial regions 3b may be, for example, substantially the same as those of the p$^+$-type partial regions 3a. A lateral direction position of an end of the p$^+$-type partial region 3b (outermost p$^+$-type partial region 3b') farthest outward is the same as that of the outermost p$^+$-type partial region 3a' (FIG. 5B). The p$^+$-type partial regions 3b are portions of the first p$^+$-type regions 3. The p$^+$-type partial regions 3a, 3b are connected along the depth direction (vertical direction) whereby the first p$^+$-type regions 3 are formed. The oxide film mask used in forming the p$^+$-type partial regions 3b is removed.

Next, for example, an oxide film (not depicted) is again formed on the surface of the n⁻-type silicon carbide layer 31b by a deposition method. A portion of the oxide film corresponding to a formation region of the active region 10 is removed by photolithography and etching. Next, for example, an n-type impurity such as nitrogen is ion implanted using the remaining portion of the oxide film as a mask (oxide film mask), forming n-type partial region 5b in the n⁻-type silicon carbide layer 31b, at a depth reaching the n-type partial region 5a. An impurity concentration of the n-type partial region 5b may be substantially the same as the n-type partial region 5a.

The n-type partial region 5b, similar to the n-type partial region 5a, is formed in the active region 10 overall and ends thereof are positioned at the boundary of the active region 10 and the edge termination region 20. The n-type partial regions 5a, 5b are connected along the depth direction whereby the n-type CS region 5 is formed. The oxide film mask used in forming the n-type partial region 5b is removed. The sequence in which the p⁺-type partial regions 3b and the n-type partial region 5b are formed may be interchanged.

Figure 6A:
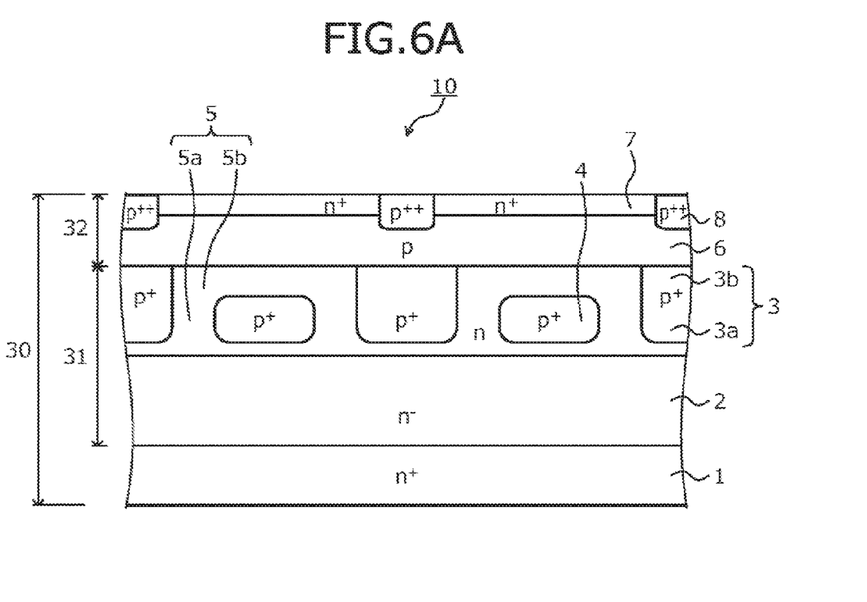
Figure 6B:
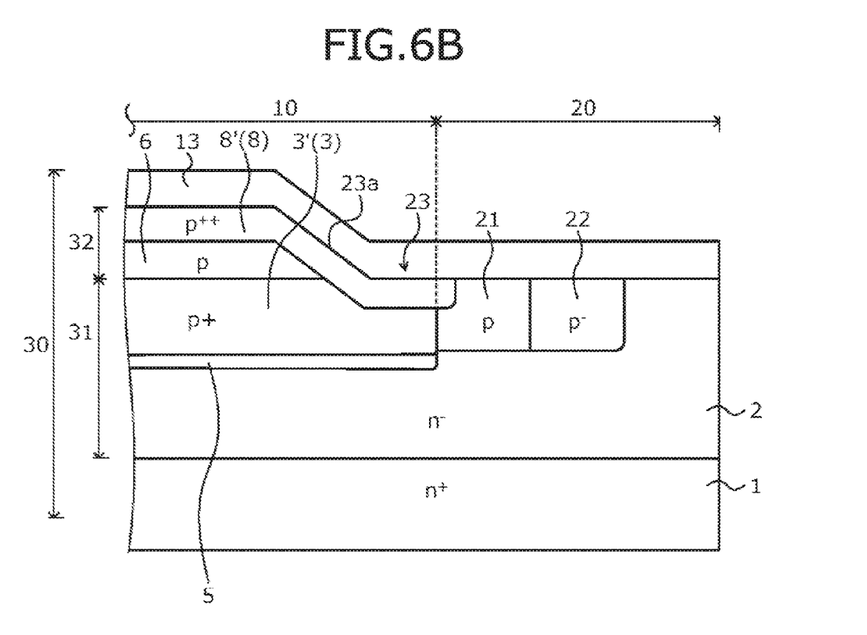

Next, as depicted in FIGS. 6A and 6B, for example, a p-type silicon carbide layer 32 doped with a p-type impurity such as aluminum is formed by epitaxial growth on the n⁻-type silicon carbide layer 31. An impurity concentration and a thickness of the p-type silicon carbide layer 32 may be, for example, about $4.0 \times 10^{17}/cm^3$ and about 1.3 μm, respectively. By the processes up to here, the silicon carbide base (semiconductor wafer) 30 is formed in which the n⁻-type silicon carbide layer 31 and the p-type silicon carbide layer 32 are sequentially stacked on the n⁺-type silicon carbide substrate 1.

Next, for example, an oxide film (not depicted) is formed on a surface of the p-type silicon carbide layer 32 by a deposition method. A portion of the oxide film corresponding to a formation region of the edge termination region 20 is removed by photolithography and etching. Etching is performed using the remaining portion of the oxide film as a mask (oxide film mask) and the p-type silicon carbide layer 32 is removed from the entire edge termination region 20. Here, surface layers of the p-type silicon carbide layer 32 and the n⁻-type silicon carbide layer 31 may be slightly removed.

Thus, the front surface of the silicon carbide base 30 is lower in the edge termination region 20 than in the active region 10, forming the drop 23 and the n⁻-type silicon carbide layer 31 is exposed at the base front surface in the edge termination region 20. When the p-type silicon carbide layer 32 is removed from the entire edge termination region 20, the p-type silicon carbide layer 32 may be removed up to an outer peripheral portion of the active region 10. The stair 23a of the drop 23 may be substantially perpendicular to the base front surface or may have a slope with respect to the base front surface.

Next, for example, an oxide film (not depicted) is formed on the base front surface by a deposition method. Portions of the oxide film corresponding to formation regions of the n⁺-type source regions 7 are removed by photolithography and etching. Next, for example, an n-type impurity such as phosphorus (P) is ion implanted using the remaining portion of the oxide film as a mask (oxide film mask), selectively forming the n⁺-type source regions 7 in a surface layer of the forming p-type silicon carbide layer 32. An impurity concentration of the n⁺-type source regions 7 may be higher than an impurity concentration of the first p⁺-type regions 3. The oxide film mask used in forming the n⁺-type source regions 7 is removed.

Next, for example, an oxide film (not depicted) is again formed on the base front surface by a deposition method. Next, portions of the oxide film corresponding to formation regions of the p⁺⁺-type contact regions 8 are removed by photolithography and etching. Next, for example, a p-type impurity such as aluminum is ion implanted using the remaining portion of the oxide film as a mask (oxide film mask), selectively forming the p⁺⁺-type contact regions 8 in the surface layer of the p-type silicon carbide layer 32. An impurity concentration of the p⁺⁺-type contact regions 8 may be higher than an impurity concentration of the second p⁺-type regions 4.

The outermost p⁺⁺-type contact region 8', at the stair 23a of the drop 23, is in contact with an side face of the p-type silicon carbide layer 32, the outermost first p⁺-type region 3' and the n-type CS region 5, and extends to the n⁻-type silicon carbide layer 31 of the edge termination region 20. An end of the outermost p⁺⁺-type contact region 8' extends farther outward along the lateral direction than the boundary of the active region 10 and the edge termination region 20 do and is positioned in the edge termination region 20 (FIG. 6B). The oxide film mask used in forming the p⁺⁺-type contact regions 8 is removed. A portion of the p-type silicon carbide layer 32 excluding the n⁺-type source regions 7 and the p⁺⁺-type contact regions 8 is the p-type base region 6.

Next, a process including oxide film mask formation, p-type impurity ion implantation and oxide film mask removal as a set is recursively performed under different conditions, forming the JTE structure (the first and the second JTE regions 21, 22). The sequence in which the n⁺-type source regions 7, the p⁺⁺-type contact regions 8, and the JTE structure are formed may be interchanged. Next, heat treatment (activation annealing) for activating all of the regions formed by ion implantation is performed, for example, at a temperature of about 1700 degrees C. for about 2 minutes. The activation annealing may be performed each time ion implantation is performed.

Figure 7:
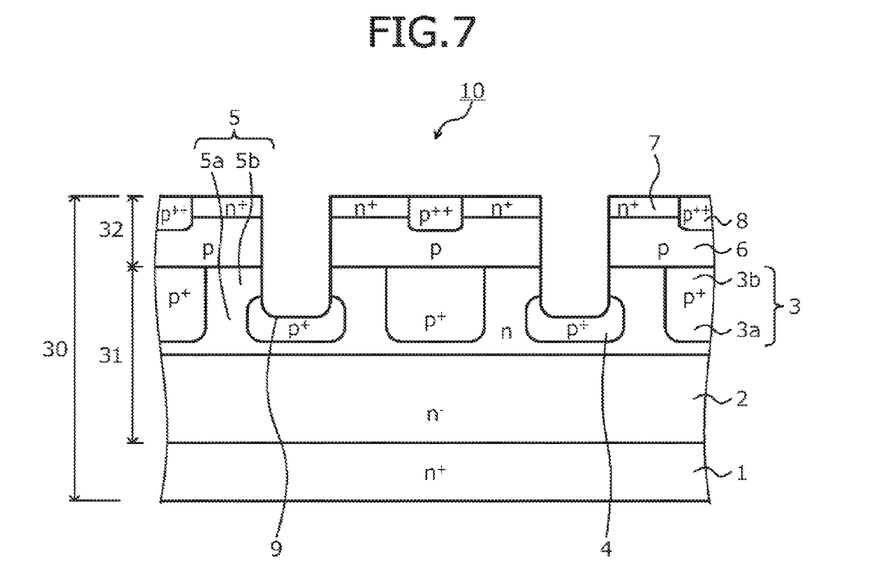

Next, as depicted in FIG. 7, for example, an oxide film (not depicted) is again formed on the base front surface by a deposition method. Portions of the oxide film corresponding to formation regions of the trenches 9 is removed by photolithography and etching. Next, etching is performed using the remaining portion of the oxide film as a mask (oxide film mask), forming the trenches 9 that penetrate the n⁺-type source regions 7 and the p-type base region 6, and reach the n-type CS region 5. The trenches 9 may reach the second p⁺-type regions 4 in the n-type CS region 5.

Figure 8:
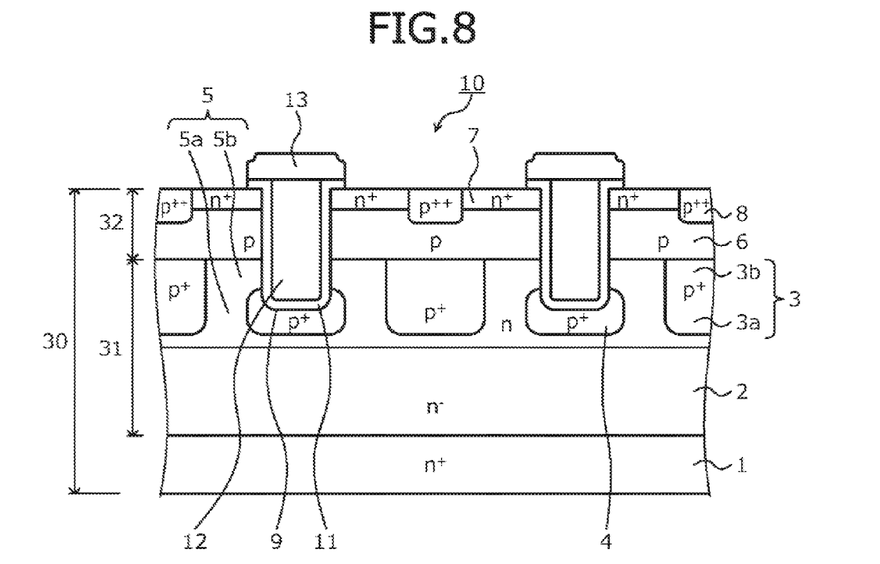

Next as depicted in FIG. 8, the gate insulating films 11 are formed along the inner walls of the trenches 9 and the front surface of the silicon carbide base 30 (surface of the p-type silicon carbide layer 32. The gate insulating films 11, for example, may be formed by thermal oxidation by heat treatment at a temperature of about 1000 degrees C. in an oxygen ($O_2$) atmosphere or may be deposited by a chemical reaction such as high temperature oxidation (HTO).

Next, for example, phosphorus doped poly-silicon (poly-Si) is deposited on the gate insulating film 11 and patterned so as to be embedded in the trenches 9 whereby the remaining poly-silicon becomes the gate electrodes 12 in the trenches 9. Here, etching back and etching may be performed so that the poly-silicon remains farther inward than a base surface portion or patterning and etching may be performed so that the poly-silicon protrudes farther outward than the base surface portion.

Next, the interlayer insulating film 13 is formed on the entire front surface of the silicon carbide base 30 to have thickness of, for example, about 1 μm, the interlayer insulating film 13 being formed so as to cover the gate electrodes 12. The interlayer insulating film 13 may be, for example, phosphosilicate glass (PSG). Next, the interlayer insulating film 13 and the gate insulating film 11 are patterned to form contact holes and expose the n⁺-type source regions 7 and the p⁺⁺-type contact regions 8. Next, the interlayer insulating film 13 is planarized by heat treatment (reflow).

Next, a conductive film that is in contact with the n⁺-type source regions 7 and the p⁺⁺-type contact regions 8 is formed from inner walls of the contact holes, onto the interlayer insulating film 13. The conductive film is patterned to remain only in the contact holes as the source electrodes 14. Next, on the rear surface (rear surface of the n⁺-type silicon carbide substrate 1) of the silicon carbide base 30, for example, a nickel (Ni) film is formed as the drain electrode 16. Next, for example, the nickel film is converted into a silicide by heat treatment at a temperature of about 970 degrees C., forming an ohmic contact of the silicon carbide base 30 and the drain electrode 16.

Next, for example, by sputtering, an aluminum film having a thickness of, for example, about 5 μm is deposited on the interlayer insulating film 13 so as to be embedded in the contact holes. The aluminum film is patterned whereby the aluminum film remains in the active region 10 as the source pad 15. Next, on the drain electrode 16, for example, a titanium (Ti) film, a nickel film, and a gold (Au) film are sequentially deposited, forming the drain pad 17. Thereafter, the semiconductor wafer is diced into individual chips whereby the MOSFET depicted in FIGS. 1 and 2 is completed.

As described, according to the first embodiment, the n-type CS region is arranged only in the active region and the outermost p⁺⁺-type contact region is extended to the edge termination region whereby the process margin of the impurity concentration of the p-type regions constituting the JTE structure may be increased. As a result, even when the n-type CS region is provided and the ON resistance is reduced, a predetermined breakdown voltage of the edge termination region may be ensured by varying the p-type regions constituting the JTE structure. Further, the ON resistance when current flows may be reduced by the n-type CS region 5, which has an impurity concentration higher than that of the n⁻-type drift region 2.

Figure 9:
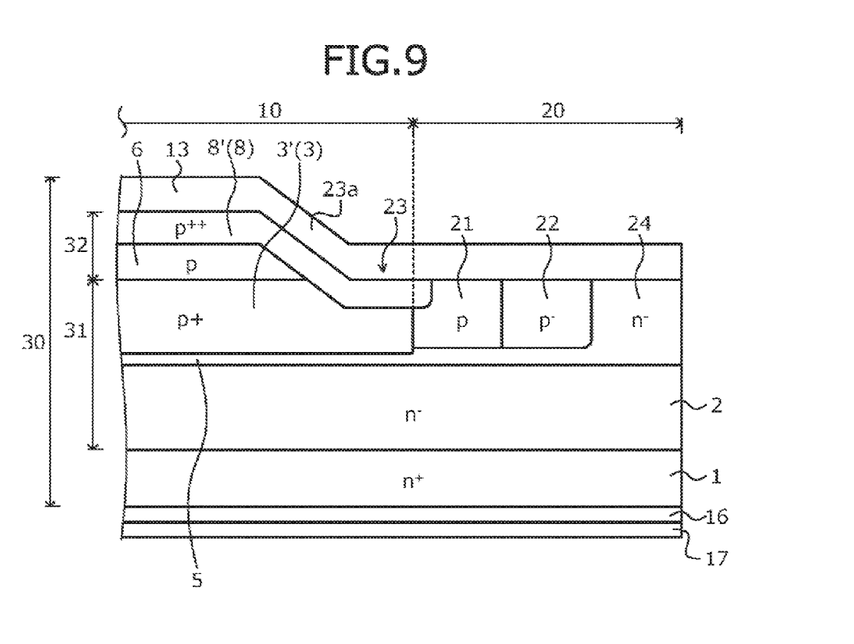
FIG. 9 is a cross-sectional view of a structure of the edge termination region of the semiconductor device according to a second embodiment.

A structure of the semiconductor device according to a second embodiment will be described. FIG. 9 is a cross-sectional view of a structure of the edge termination region of the semiconductor device according to the second embodiment. Configuration of the active region 10 of the semiconductor device according to the second embodiment is identical to that of the first embodiment (refer to FIG. 1). The semiconductor device according to the second embodiment differs from the semiconductor device according to the first embodiment on the following 2 points. A first difference is that the n-type CS region 5 is constituted by an n-type silicon carbide layer formed by epitaxial growth at the same impurity concentration as that of the n-type CS region 5 after completion.

A second difference is that an n⁻-type region (sixth semiconductor region) 24 is provided across the entire edge termination region 20. The n⁻-type region 24 is exposed at the base front surface in the edge termination region 20. The JTE structure (the first and the second JTE regions 21, 22) is provided in the n⁻-type region 24. A depth of an interface of the n⁻-type region 24 and the n⁻-type drift region 2 is at a position substantially equal to a depth of an interface of the n-type CS region 5 and the n⁻-type drift region 2 or slightly on the drain side. An impurity concentration of the n⁻-type region 24 may be lower than an impurity concentration of the n-type CS region 5 or preferably, may be the impurity concentration of the n⁻-type drift region 2 or less.

Figure 10:
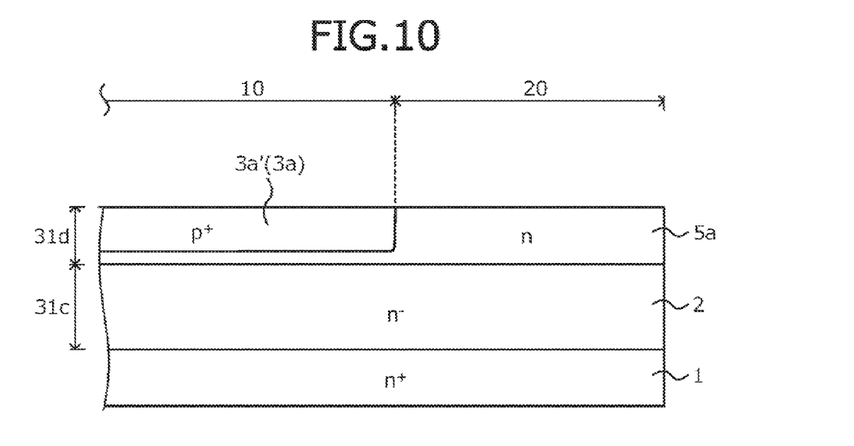
FIGS. 10, 11, and 12 are cross-sectional views of the semiconductor device according to the second embodiment during manufacture.
Figure 11:
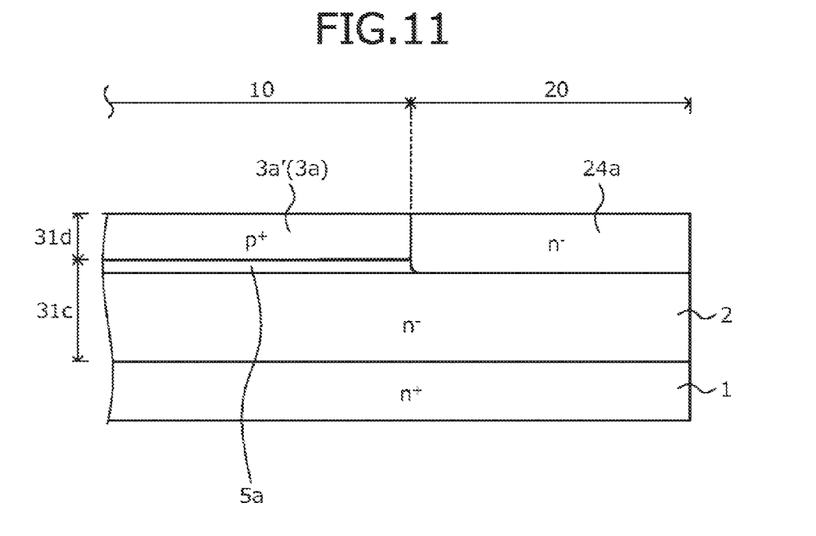
Figure 12:
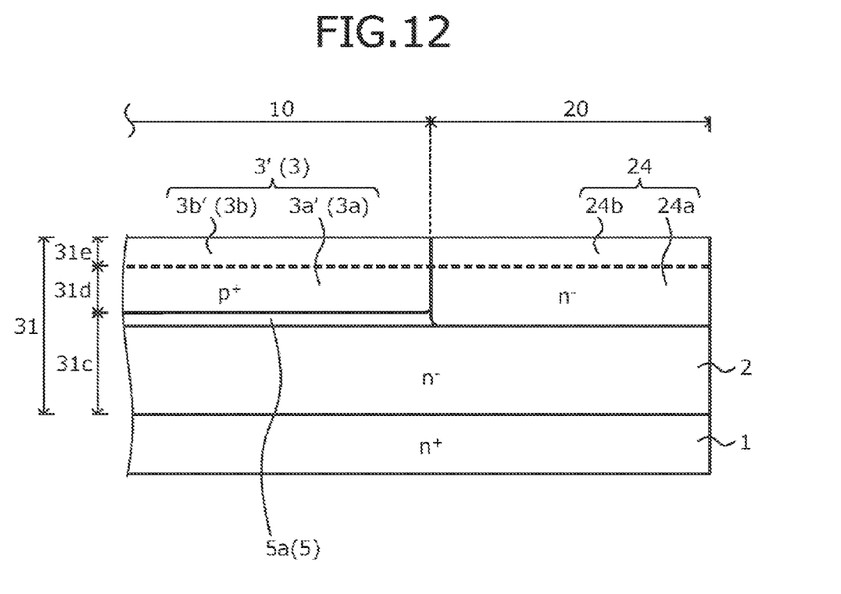

Next, a method of manufacturing the semiconductor device according to the second embodiment will be described. FIGS. 10, 11, and 12 are cross-sectional views of the semiconductor device according to the second embodiment during manufacture. In FIGS. 10 to 12, the edge termination region 20 is depicted. First, similar to the first embodiment, the n⁺-type silicon carbide substrate 1 is prepared. Next, as depicted in FIG. 10, on the front surface of the n⁺-type silicon carbide substrate 1, an n⁻-type silicon carbide layer 31c that is the n⁻-type drift region 2 and an n-type silicon carbide layer 31d that becomes the n-type partial region 5a are sequentially formed by epitaxial growth.

Next, similar to the first embodiment, the p⁺-type partial regions 3a and the second p⁺-type regions 4 are selectively formed in the n-type silicon carbide layer 31d in the active region 10. A cross-section of the structure of the active region 10 at this stage is the same as that obtained by substituting the stacked structure of the n⁻-type silicon carbide layer 31c and the n-type silicon carbide layer 31d for the region represented by reference numeral 31a in FIG. 4A. At this stage, in the edge termination region 20, an n-type silicon carbide layer 31e is exposed at the base front surface. Therefore, an n-type impurity concentration of the base front surface side in the edge termination region 20 is equal to that of the n-type CS region 5. Here, the n-type silicon carbide layer 31d in the edge termination region 20 is implanted with a p-type impurity, lowering the n-type impurity concentration.

In particular, for example, an oxide film (not depicted) is formed on the base front surface by a deposition method. A portion of the oxide film corresponding to a formation region of the edge termination region 20 is removed by photolithography and etching. Next, a p-type impurity is ion implanted using the remaining portion of the oxide film as a mask (oxide film mask) and the entire n-type silicon carbide layer 31d in the edge termination region 20 is implanted with a p-type impurity, forming an n⁻-type region (hereinafter, n⁻-type partial region) 24a having an impurity concentration lower than that of n-type silicon carbide layer 31d. The n⁻-type partial region 24a is a portion of the n⁻-type region 24. The sequence in which the p⁺-type partial regions 3a, the second p⁺-type regions 4, and the n⁻-type partial region 24a are formed may be interchanged. The oxide film mask used in forming the n⁻-type partial region 24a is removed.

Next, as depicted in FIG. 12, the n-type silicon carbide layer 31e to become the n-type partial region 5b is formed by epitaxial growth on a surface of the n-type silicon carbide layer 31d. The n⁻-type silicon carbide layer 31c and the n-type silicon carbide layers 31d, 31e constitute the n⁻-type silicon carbide layer 31 depicted in FIG. 9. Next, similar to the first embodiment, the p⁺-type partial regions 3b are selectively formed in the n-type silicon carbide layer 31e in the active region 10. A cross-section of the structure of the active region 10 at this stage is the same as that obtained by substituting the reference numeral 31e for the reference numeral 31b in FIG. 5A.

Further, for example, an oxide film (not depicted) is formed on the base front surface by a deposition method. A portion of the oxide film corresponding to a formation region of the edge termination region 20 is removed by photolithography and etching. Next, a p-type impurity is ion implanted using the remaining portion of the oxide film as a mask (oxide film mask) to be implanted in the entire n-type silicon carbide layer 31e in the edge termination region 20 where an n⁻-type partial region 24b is formed having an impurity concentration that is lower than that of the n-type silicon carbide layer 31e. The n⁻-type partial region 24b is a portion of the n⁻-type region 24. The n⁻-type partial regions 24a, 24b are connected along the depth direction whereby the n⁻-type region 24 is formed. The sequence in which the p⁺-type partial regions 3b and the n⁻-type partial region 24b are formed may be interchanged.

Thereafter, similar to the first embodiment, processes from the deposition of the p-type silicon carbide layer 32 to the formation of the JTE structure are sequentially performed. The JTE structure is formed in the n⁻-type region 24. Thus, the MOSFET depicted in FIGS. 1 and 9 is completed.

Further, without limitation to the method of manufacturing the semiconductor device according to the second embodiment, provided the n-type impurity concentration of a substrate front surface in the edge termination region 20 may be reduced, various modifications of the method are possible. For example, without forming the n⁻-type partial regions 24a, 24b separately, after the n-type silicon carbide layer 31e is formed by epitaxial growth, the n⁻-type region 24 may be formed by a single session of ion implantation of a p-type impurity. Further, after the drop 23 is formed at the front surface of the silicon carbide base 30, the n⁻-type region 24 may be formed by a single session of ion implantation of a p-type impurity. The sequence in which the n⁻-type region 24, the n⁺-type source regions 7, the p⁺⁺-type contact regions 8, and the JTE structure are formed may be interchanged.

Further, when the n⁻-type region 24 is formed only in the n-type silicon carbide layer 31d and the drop 23 between the active region 10 and the edge termination region 20 is formed, the p-type silicon carbide layer 32 and the n-type silicon carbide layer 31e may be removed in the edge termination region 20, exposing the n⁻-type region 24. Further, without forming the n⁻-type region 24, when the drop 23 between the active region 10 and the edge termination region 20 is formed, the p-type silicon carbide layer 32 and the n-type silicon carbide layers 31e, 31d may be removed in the edge termination region 20, exposing the n⁻-type silicon carbide layer 31c.

As described, according to the second embodiment, even when the n-type CS region is constituted by an epitaxial layer, the n-type impurity concentration of the epitaxial layer is reduced in the edge termination region, enabling effects identical to those of the first embodiment to be obtained.

Figure 13:
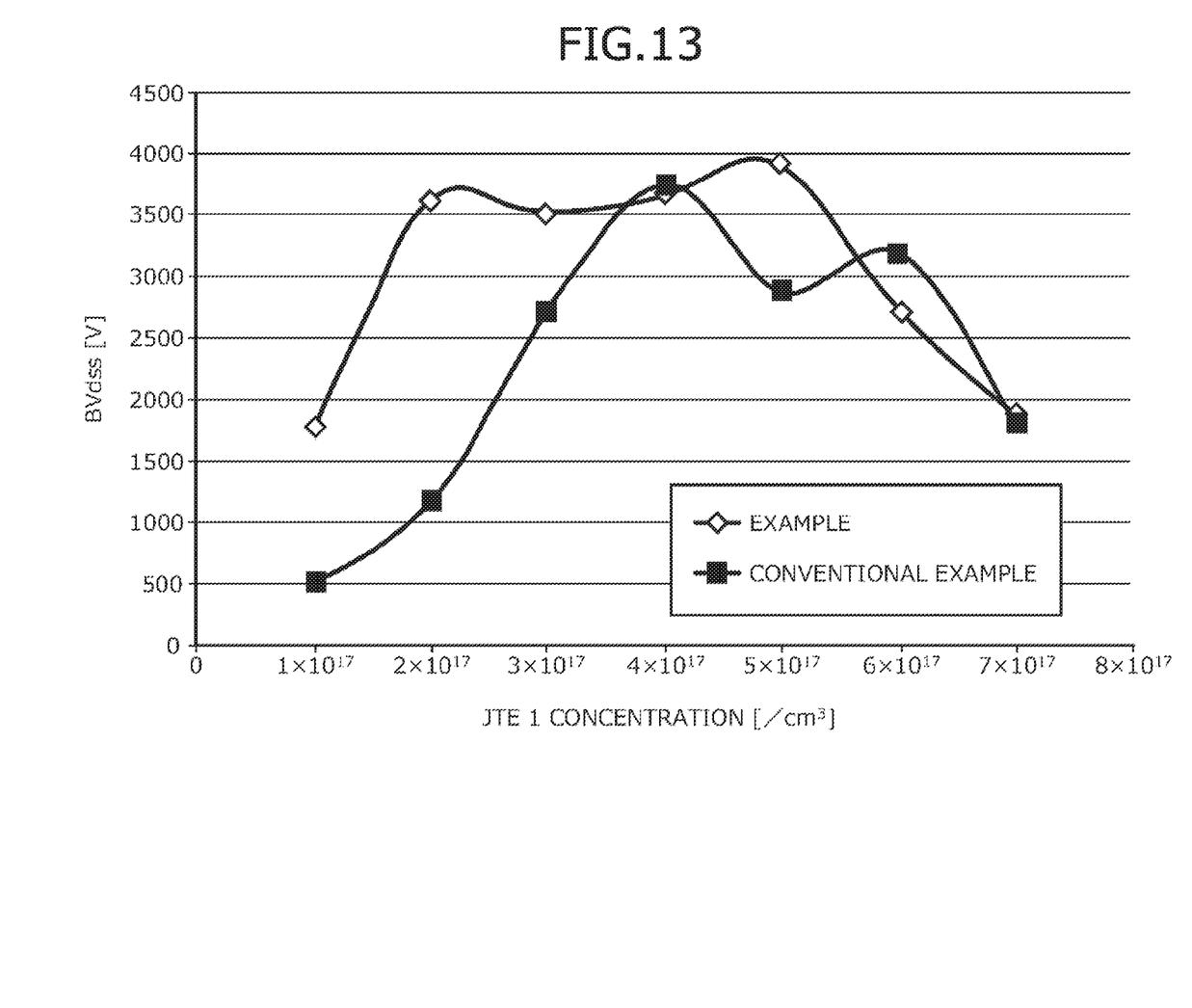
FIG. 13 is a characteristics diagram of breakdown voltage characteristics of a semiconductor device according to an example.

Verification of the breakdown voltage of the edge termination region 20 will be described. FIG. 13 is a characteristics diagram of breakdown voltage characteristics of a semiconductor device according to an example. In FIG. 13, a horizontal axis represents the impurity concentration (JTE 1 concentration) of a first JTE region and a vertical axis represents breakdown voltage of the edge termination region. In a MOSFET corresponding to the first embodiment (hereinafter, example), the impurity concentration of the first JTE region 21 was varied and obtained breakdown voltage characteristics of the edge termination region 20 are depicted in FIG. 13. In the example, the n-type CS region 5 is provided only in the active region 10 and the outermost p⁺⁺-type contact region 8' is extended to the edge termination region 20.

FIG. 13 further depicts breakdown voltage characteristics of the edge termination region 120 of a conventional example (refer to FIG. 14). In the conventional example, the n-type CS region 105 extends to the chip edge and an outermost p⁺⁺-type contact region 108' terminates in the active region 110. Other than the n-type CS region 105 and the outermost p⁺⁺-type contact region 108', regions and conditions of the conventional example are identical to those of the example. As depicted in FIG. 13, it is found that in the conventional example, to ensure a breakdown voltage of 3500V or higher, an impurity concentration of a first JTE region 121 has to be set in a narrow range close to $4 \times 10^{17}/\text{cm}^3$ and there is a low degree of freedom in the design of the JTE structure.

On the other hand, from the results depicted in FIG. 13, it was confirmed that in the example, in ensuring a breakdown voltage of 3500V or higher, the impurity concentration of the first JTE region 21 may be set in a range from $2.0 \times 10^{17}/\text{cm}^3$ to $5.5 \times 10^{17}/\text{cm}^3$ and compared to the conventional example, the process margin of the first JTE region 21 is wide. Therefore, the present invention enables a high degree of freedom in the design of the JTE structure and maintenance of the breakdown voltage of the edge termination region 20 even when the n-type CS region 5 is provided and the ON resistance is reduced.

The present invention may be variously modified within a range no departing from the spirit of the present invention. For example, in the described embodiments, dimensions, impurity concentrations, etc. of regions may be set according to required specifications. Further, the present invention is not limited to a MOSFET and is applicable to a MOS-type semiconductor device such as an IGBT. Further, even when a wide bandgap semiconductor other than silicon carbide is used in the present invention, identical effects are achieved. The present invention is further applicable to a semiconductor device that uses silicon. In the embodiments, although a first conductivity type is assumed as an n-type and a second conductivity type is assumed as a p-type, the present invention is similarly implemented when the first conductivity type is a p-type and the second conductivity type is an n-type.

As described, the semiconductor device according to the present invention enables the process margin of the JTE structure to be increased whereby the semiconductor achieves effects in that low ON resistance may be achieved while characteristics of ON resistance and breakdown voltage may be maintained.

As described, the semiconductor device according to the present invention is useful for semiconductor devices that include a JTE structure in the edge termination region and is particularly suitable for semiconductor devices that use a wide bandgap semiconductor.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device including an active region through which current flows and an edge termination region, comprising:
   a breakdown voltage structure in the edge termination region outside the active region;
   a semiconductor substrate containing a semiconductor material having a bandgap wider than that of silicon;

a first semiconductor layer provided on a front surface of the semiconductor substrate, the first semiconductor layer containing the semiconductor material;

a second semiconductor layer provided in the active region, on a surface on a first side of the first semiconductor layer opposite a second side of the first semiconductor layer facing the semiconductor substrate, the second semiconductor layer containing the semiconductor material;

a first semiconductor region of the second conductivity type selectively provided in a surface layer on the first side of the first semiconductor layer, the first semiconductor region being in contact with a base region of the second semiconductor layer, an impurity concentration of the first semiconductor region being higher than that of the base region of the second semiconductor layer;

a second semiconductor region of the second conductivity type selectively provided in the first semiconductor layer to be separate from the second semiconductor layer and the first semiconductor region, an impurity concentration of the second semiconductor region being higher than that of the base region of the second semiconductor layer;

a third semiconductor region of the first conductivity type selectively provided in a surface layer on the first side of the first semiconductor layer to be in contact with the first semiconductor region and the second semiconductor region, an impurity concentration of the third semiconductor region being higher than that of a drift region of the first semiconductor layer adjacent to the semiconductor substrate;

a fourth semiconductor region of the first conductivity type selectively provided in the second semiconductor layer;

a fifth semiconductor region of the second conductivity type selectively provided in the second semiconductor layer, an impurity concentration of the fifth semiconductor region being higher than that of the base region of the second semiconductor layer;

a trench penetrating the fourth semiconductor region and the second semiconductor layer and reaching the third semiconductor region, an end of the trench located in the second semiconductor region in a depth direction;

a gate electrode provided in the trench, via a gate insulating film;

a first electrode in contact with the fourth semiconductor region; and a second electrode provided on a rear surface of the semiconductor substrate, wherein the third semiconductor region is in the active region, the first semiconductor region is flush with an end of the active region, and the third semiconductor region is either flush with an end of the first semiconductor region at the end of the active region or the third semiconductor region extends past the end of the first semiconductor region into the edge termination region.

2. The semiconductor device according to claim 1, wherein
the third semiconductor region extends past the end of the first semiconductor region and terminates past the end of the first semiconductor region.

3. The semiconductor device according to claim 1, wherein
the third semiconductor region is located only in the active region.

4. The semiconductor device according to claim 1, wherein
the third semiconductor region is in contact with the breakdown voltage structure.

5. The semiconductor device according to claim 1, comprising
a sixth semiconductor region of the first conductivity type in the first semiconductor layer, the sixth semiconductor region being in contact with the third semiconductor region, and an impurity concentration of the sixth semiconductor region being lower than that of the third semiconductor region, wherein
the breakdown voltage structure is provided in the sixth semiconductor region.

6. The semiconductor device according to claim 5, wherein
the impurity concentration of the sixth semiconductor region is equal to or lower than that of the drift region of the first semiconductor layer.

7. The semiconductor device according to claim 5, wherein
the third semiconductor region is an epitaxial layer provided between the drift region of the first semiconductor layer and the base region of the second semiconductor layer, and
the sixth semiconductor region is provided in a portion of the epitaxial layer outside the active region and penetrates the epitaxial layer in the depth direction.

8. The semiconductor device according to claim 1, wherein
the breakdown voltage structure is constituted by a plurality of seventh semiconductor regions of the second conductivity type provided in the surface layer on the first side of the first semiconductor layer,
the plurality of seventh semiconductor regions have a concentric shape surrounding a periphery of the active region, and
respective impurity concentrations of the plurality of seventh semiconductor regions are lower than that of the base region of the second semiconductor layer and are inversely related to a distance of the plurality of seventh semiconductor regions from the active region.

9. The semiconductor device according to claim 1, wherein
the semiconductor material is silicon carbide.

* * * * *

UNITED STATES PATENT AND TRADEMARK OFFICE
CERTIFICATE OF CORRECTION

Page 1 of 1

PATENT NO. : 10,008,592 B1
APPLICATION NO. : 15/800884
DATED : June 26, 2018
INVENTOR(S) : Takahito Kojima et al.

It is certified that error appears in the above-identified patent and that said Letters Patent is hereby corrected as shown below:

On the Title Page

Item (73) (Assignee):
Please replace the Assignee name with the following:
-- FUJI ELECTRIC CO., LTD.
Kawasaki-Shi, Kanagawa (JP)
NATIONAL INSTITUTE OF ADVANCED INDUSTRIAL SCIENCE AND TECHNOLOGY
Tokyo (JP) --

Signed and Sealed this
Twentieth Day of August, 2019

Andrei Iancu
*Director of the United States Patent and Trademark Office*